United States Patent
Usami (10) Patent No.: US 6,498,398 B1
(45) Date of Patent: *Dec. 24, 2002

(54) SEMICONDUCTOR DEVICE HAVING THROUGH HOLES SELECTIVELY THROUGH ISOLATION MATERIAL COVERING WIRINGS THAT ARE RELATIVELY FAR APART

(75) Inventor: Tatsuya Usami, Tokyo (JP)

(73) Assignee: NEC Corporation, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 49 days.

(21) Appl. No.: 08/995,298

(22) Filed: Dec. 22, 1997

(30) Foreign Application Priority Data

Dec. 25, 1996 (JP) ............................................. 8-344721

(51) Int. Cl.⁷ ..................... H01L 23/48; H01L 23/52; H01L 29/40
(52) U.S. Cl. ........................................ 257/759; 257/760
(58) Field of Search ............................... 257/773, 758, 257/759, 750, 624, 760; 438/624, 623, 622

(56) References Cited

U.S. PATENT DOCUMENTS

| | | | | |
|---|---|---|---|---|
| 5,591,677 A | * | 1/1997 | Jeng ............................. | 437/195 |
| 5,665,657 A | * | 9/1997 | Lee ............................. | 438/624 |
| 5,708,303 A | * | 1/1998 | Jeng ............................. | 257/758 |
| 5,744,865 A | * | 4/1998 | Jeng et al. .................... | 257/758 |
| 5,789,818 A | * | 8/1998 | Havemann .................... | 257/758 |
| 5,821,621 A | * | 10/1998 | Jeng ............................. | 257/759 |
| 6,184,121 B1 | * | 2/2001 | Buchwalter et al. ......... | 438/622 |

FOREIGN PATENT DOCUMENTS

| | | |
|---|---|---|
| EP | 0 687 005 A2 | 6/1995 |
| EP | 0 706 216 A2 | 10/1995 |
| EP | 0 805 491 A2 | 4/1997 |
| JP | 55913/1996 | 2/1996 |
| JP | 8-64598 | 3/1996 |
| JP | 8-172132 | 7/1996 |
| JP | 8-195437 | 7/1996 |

OTHER PUBLICATIONS

Jeng et al. "Implementation of Low–Dielectric–Constant Materials for ULSI Circuit Performance Improvement", Proceedings of the 1995 International Symposium on VLSI Technology, Systems and Applications, pp 164–168).*
Jeng, S. et al., "A Planarized Multilevel Interconnect Scheme with Embedded Low Dielectric Constant Polymers for Sub–Quarter Micron Applications", 1994 Symposium on VLSI Technology Digest of Technical papers, pp. 73–74.

* cited by examiner

*Primary Examiner*—Phat X. Cao
(74) *Attorney, Agent, or Firm*—Choate, Hall & Stewart (57) ABSTRACT

The present invention provides a semiconductor device comprising:
  a semiconductor substrate having semiconductor elements, and
  a plurality of wirings formed on the semiconductor substrate via an isolation film,
wherein the wirings are formed in at least one layer level so that the region in which the wirings are formed is divided into a wiring region of small wiring-to-wiring distance and a wiring region of large wiring-to-wiring distance; a first inter-level isolation film is selectively formed in the wiring region of small wiring-to-wiring distance and a second inter-level isolation film is formed in the wiring region of large wiring-to-wiring distance to cover the wirings; throughholes are formed only in the second inter-level isolation film; and the dielectric constant of the first inter-level isolation film is smaller than the dielectric constant of the second inter-level isolation film.

This semiconductor device has a fine multi-layered wiring structure of high performance and remarkably improved reliability.

22 Claims, 8 Drawing Sheets

SEMICONDUCTOR DEVICE HAVING THROUGH HOLES SELECTIVELY THROUGH ISOLATION MATERIAL COVERING WIRINGS THAT ARE RELATIVELY FAR APART

BACKGROUND OF THE INVENTION (i) Field of the Invention

The present invention relates to a semiconductor device and a process for production thereof. More particularly, the present invention relates to a fine wiring structure of semiconductor device and a process for production thereof.

(ii) Description of the Prior Art

As the semiconductor elements of semiconductor device become finer, the semiconductor device must have a finer multi-layered wiring structure. Currently, in semiconductor devices having such a multi-layered wiring structure, there is mainly used, as the inter-level isolation film, a silicon oxide-based isolation film of relatively small dielectric constant and stable quality so that the parasitic capacitance between upper-layer wirings and lower-layer wirings and between adjacent wirings in the same wiring layer level can be reduced.

As the semiconductor elements become finer, the wiring width and wiring-to-wiring distance of lower-layer wirings are made smaller; however, in order to avoid an increase in wiring resistance, the wirings in said wiring layer level must have a certain cross-sectional area. As a result, both the aspect ratio of a wiring (wiring height/wiring width) and the aspect ratio between wirings (wiring height/wiring-to-wiring distance) become large. This invites a significant increase in parasitic capacitance between wirings, resulting in (1) reduction in transfer speed of signal and (2) frequent occurrence of cross-talk between wiring layers (occurrence of signal noise between adjacent wirings).

Further, if the inter-level isolation film has a large step in the surface, when an upper wiring layer is formed, it is impossible to form a fine resist pattern by photolithography owing to the shortage of focus margin. Even if it is possible, the above-mentioned difference in surface level gives rise to (1) the wiring disconnection in upper-layer wirings and (2) remaining of unetched wiring material at the sites of level difference. Thus, the inter-level isolation film must have a flat surface.

In order to avoid the above-mentioned problems appearing in a fine multi-layered wiring structure, there have been proposed various techniques of using an inter-level isolation film of low dielectric constant. An example of such techniques is a technique disclosed in Japanese Patent Application Laid-Open No. 55913/1996. This technique is described below with reference to FIG. 7 and FIG. 8, both of which are sectional views showing the key production steps of the wiring structure used in the technique.

Figure 7A:
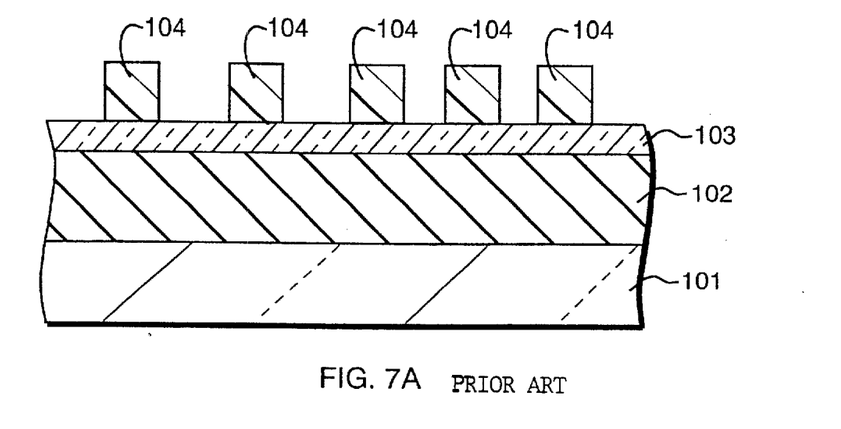
FIGS. 7A, 7B, 7C are sectional views showing the major production steps of the conventional semiconductor device, for explaining the prior art.

As shown in FIG. 7(a), a thick isolation film 101 is formed on a semiconductor substrate. On the thick isolation film 101 are formed a metal layer 102 and a first dielectric layer 103 in this order. On the first dielectric layer 103 is provided a resist mask 104. The first dielectric layer 103 is a highly reliable isolation film made of silicon oxide or the like.

Figure 7B:
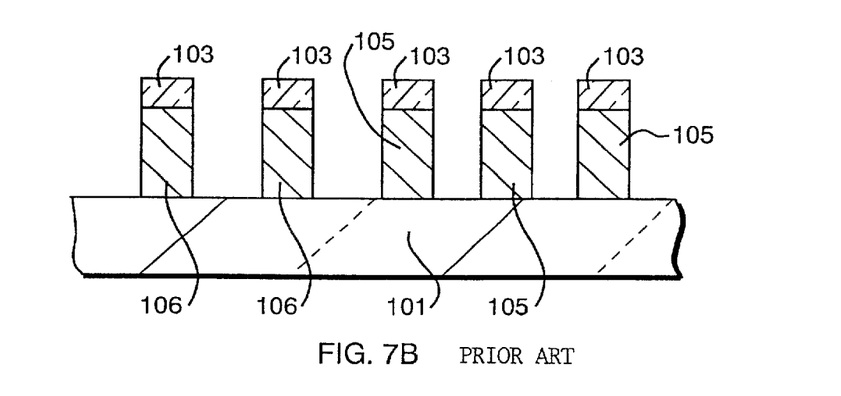

Then, the first dielectric layer 103 and the metal layer 102 are subjected to reactive ion etching (RIE) by using the resist mask 104 as an etching mask. Thereafter, the remaining resist mask 104 is removed. Thus, as shown in FIG. 7(b), wirings 105 of small wiring-to-wiring distance and wirings 106 of large wiring-to-wiring distance are formed on the thick isolation film 101.

Figure 7C:
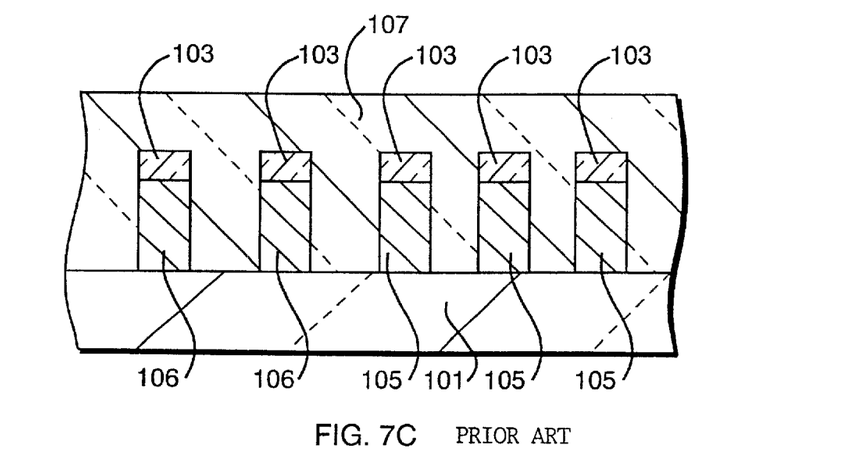

Next, as shown in FIG. 7(c), a low-dielectric constant material 107 is applied so as to cover the whole surfaces of the thick isolation film 101, the wirings 105 of small wiring-to-wiring distance, the wirings 106 of large wiring-to-wiring distance and the first dielectric layer 103, followed by levelling of the surface of the applied low-dielectric constant material. As the low-dielectric constant material 107, there is used, for example, a dielectric made of a polymer such as Teflon (trade mark), Parylene (trade mark) or the like.

Figure 8A:
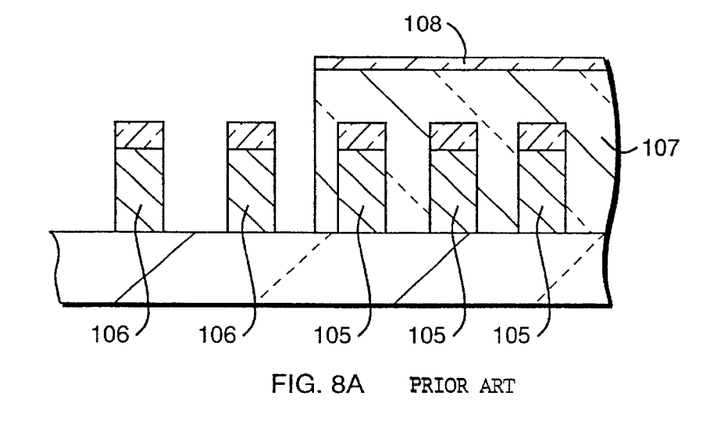
FIGS. 8A, 8B, 8C are sectional views showing the production steps of the conventional semiconductor device, for explaining the prior art.

On the whole surface of the low-dielectric constant material 107 is formed a hard oxide mask 108 as a resist layer. Then, the material 107 and the mask 108 are subjected to selectvie etching. That is, as shown in FIG. 8(a), the low-dielectric constant material 107 and the hard oxide mask 108 both in the region of wirings 106 of large wiring-to-wiring distance are removed and those in the region of wirings 105 of small wiring-to-wiring distance are allowed to remain.

Figure 8B:
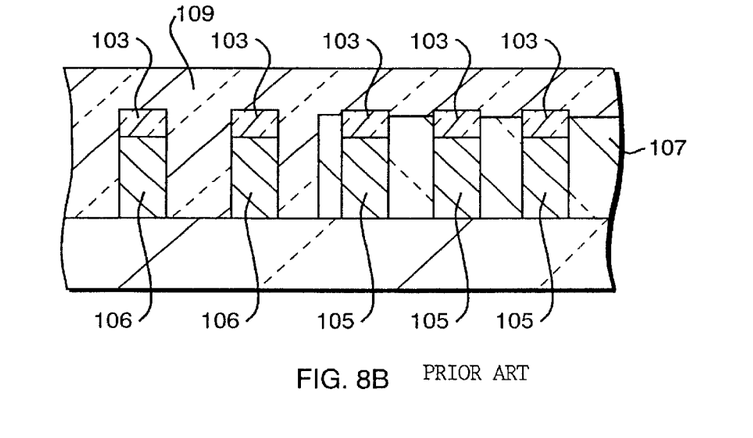

Next, the hard oxide mask 108 on the region of the wirings 105 of small wiring-to-wiring distance is removed. As shown in FIG. 8(b), the low-dielectric constant material 107 is etched back and removed down to a level lower than the upper surface of the first dielectric layer 103 by dry etching. In that case, the first dielectric layer 103 functions as an etching stopper for the low-dielectric constant material 107. Preferably, the low-dielectric constant material 107 is not etched down to a level lower than the top of the wirings 105 of small wiring-to-wiring distance.

Next, as shown in FIG. 8(b), a second dielectric layer 109 is formed by deposition on the whole surface of the resulting material, that is, so as to cover the wirings 106 of large wiring-to-wiring distance, the first dielectric layer 103 and the etched-back low-dielectric constant material 107, then the surface of the second dielectric layer 109 is leveled. The second dielectric layer 109 is an isolation film made of silicon oxide or the like.

As above, on the thick isolation film 101 formed on a semiconductor substrate are formed lower-layer wirings and inter-level isolation films. In that case, a highly reliable isolation film made of silicon oxide or the like is formed in the region of large wiring-to-wiring distance, and a low-dielectric constant material is filled in the region of small wiring-to-wiring distance.

Figure 8C:
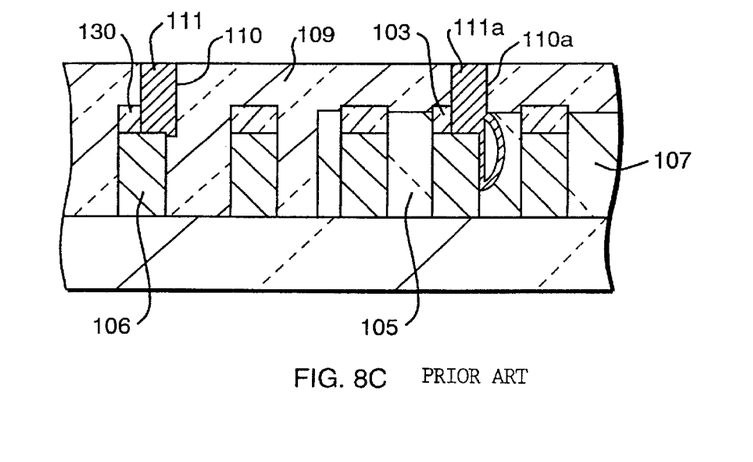

In forming a multi-layered wiring structure (this is not mentioned in the above literature), it is necessary to connect the lower-layer wirings formed by the prior art, with upper-layer wirings. In that case, as shown in FIG. 8(c), through-holes 110 and 110a are formed on a wiring 106 of large wiring-to-wiring distance and a wiring 105 of small wiring-to-wiring distance, respectively. Into the throughholes 110 and 110a are formed metal plugs 111 and 111a, respectively, and the lower-layer wirings and the upper-layer wirings are electrically connected with the metal plugs.

In the prior art as mentioned above, an isolation film of low-dielectric constant is selectively formed in the region of small wiring-to-wiring distance, of the wiring structure of semiconductor device. In this prior art, etching back of low-dielectric constant material 107 is necessary as mentioned with respect to FIG. 8(b). However, in the etching back, the etching-back depth of low-dielectric constant material is very difficult to control. It is also difficult to improve the uniformity of etching-back depth in a semiconductor wafer. Therefore, it is difficult to apply the prior art to production of a semiconductor having a fine wiring structure or using a semiconductor wafer of large diameter (e.g. diameter of 12 in.).

In the prior art, a first dielectric layer 103 and a second dielectric layer 109 are formed on or above both wirings 105 of small wiring-to-wiring distance and wirings 106 of large wiring-to-wiring distance. That is, no low-dielectric constant material 107 is formed on these wirings. Therefore, throughholes can be formed on these wirings. However, if mask alignment is deviated form the predetermined position as shown in FIG. 8(c) in the photolithography employed for throughhole formation, the low-dielectric constant material 107 is also etched in the region of wirings 105 of small wiring-to-wiring distance. When the low-dielectric constant material 107 is made of a polymer having a relative dielectric constant of 3 or less such as mentioned in the above-cited literature, the throughhole 110a formed in the region of wirings 105 of small wiring-to-wiring distance has a very disadvantageous shape. That is, the throughhole extends even to a direction perpendicular to the throughhole axial direction and comes to contain a void, whereby formation of a reliable metal plug 111a is difficult and the resulting semiconductor device has significantly reduced reliability.

SUMMARY OF THE INVENTION

The objects of the present invention are to provide a simple process for stably forming a fine wiring structure of semiconductor device; a fine multi-layered wiring structure of high performance and high reliability, of semiconductor device; and a process for forming such a fine multi-layered wiring structure.

According to the present invention, there is provided a semiconductor device comprising:

a semiconductor substrate having semiconductor elements, and a plurality of wirings formed on the semiconductor substrate via an isolation film, wherein the wirings are formed in at least one layer level so that the region in which the wirings are formed is divided into a wiring region of small wiring-to-wiring distance and a wiring region of large wiring-to-wiring distance; a first inter-level isolation film is selectively formed in the wiring region of small wiring-to-wiring distance and a second inter-level isolation film is formed in the wiring region of large wiring-to-wiring distance to cover the wirings; throughholes are formed only in the second inter-level isolation film; and the dielectric constant of the first inter-level isolation film is smaller than the dielectric constant of the second inter-level isolation film.

According to the present invention, there is also provided a semiconductor device comprising:

a semiconductor substrate having semiconductor elements, and a plurality of wirings formed on the semiconductor substrate via an isolation film, wherein the wirings are formed in at least one layer level so that the region in which the wirings are formed is divided into a wiring region of small wiring-to-wiring distance and a wiring region of large wiring-to-wiring distance; a first inter-level isolation film is selectively formed in the wiring region of small wiring-to-wiring distance, a second inter-level isolation film is formed in the wiring region of large wiring-to-wiring distance to cover the wirings; and a third inter-level isolation film is formed so as to cover the first inter-level-isolation film and the second inter-level isolation film; throughholes are formed only in the second inter-level isolation film and the third inter-level isolation film; and the dielectric constant of the first inter-level isolation film is smaller than the dielectric constants of the second inter-level isolation film and the third inter-level isolation film.

In each of the above semiconductors, it is preferable that the isolation film on the substrate is dented at the surface areas corresponding to the wiring region of small wiring-to-wiring distance but not covered by the wirings of the region and the resulting dents are filled with the first inter-level isolation film.

In each of the above semiconductors, the first inter-level isolation film is constituted by an organic film, an organic SOG film, a polyimide film, a porous inorganic SOG film having a density smaller than that of silicon oxide film, a porous organic SOG film, or a porous organic film, and the second inter-level isolation film is constituted by a silicon oxide film or a silicon oxynitride film.

In each of the above semiconductors, when the wirings are formed in a multi-layered wiring structure, both the lower layer and the upper layer have the above-mentioned wiring structure.

According to the present invention, there is also provided a process for producing a semiconductor device, which comprises:

a step of forming a plurality of wirings on a semiconductor substrate via an isolation film so that the region in which the wirings are formed is divided into a wiring region of small wiring-to-wiring distance and a wiring region large wiring-to-wiring distance, and forming thereon a first inter-level isolation film so as to cover the wirings and then a protective isolation film in this order, a step of selectively removing the first inter-level isolation film and the protective isolation film present on and in the wiring region of large wiring-to-wiring distance, a step of forming, by deposition, a second inter-level isolation film on the whole surface of the resulting material and then subjecting the second inter-level isolation film to chemical mechanical polishing with the protective isolation film used as an etching stopper, to obtain a flat surface, and a step of forming throughholes only in the second inter-level isolation film.

In the above process, the dielectric constant of the first inter-level isolation film is smaller than the dielectric constant of the second inter-level isolation film and the protective isolation film is more resistant to the chemical mechanical polishing than the second inter-level isolation film.

According to the present invention, there is also provided a process for producing a semiconductor device, which comprises:

a step of forming a plurality of wirings on a semiconductor substrate via an isolation film so that the region in which the wirings are formed is divided into a wiring region of small wiring-to-wiring distance and a wiring region large wiring-to-wiring distance, and forming thereon a second inter-level isolation film so as to cover the wirings, a step of selectively removing the second inter-level isolation film present on and in the wiring region of small wiring-to-wiring distance, a step of forming, by deposition, a first inter-level isolation film on the whole surface of the resulting material, and then subjecting the first inter-level isolation film to chemical mechanical polishing with the second inter-level isolation film used as an etching stopper to obtain a flat surface, and a step of forming throughholes only in the second inter-level isolation film.

In the above process, the dielectric constant of the first inter-level isolation film is smaller than the dielectric constant of the second inter-level isolation film and the second inter-level isolation film is more resistant to the chemical mechanical polishing than the first inter-level isolation film.

In FIGS. 1–8;
1 is a base inter-level isolation film formed on a semiconductor substrate;
1a is a semiconductor chip;
2 and 2a are each a lower-layer wiring;
3 is a first inter-level isolation film;
4 is a protective isolation film;
5 and 5a are each a second inter-level isolation film;
6, 16, 110 and 110a are each a throughhole;
7, 111 and 111a are each a metal plug;
8 and 8a are each an upper-layer wiring;
9 is a first inter-level isolation film in upper layer;
10 and 10a are each a second inter-level isolation film in upper layer;
11 is a throughhole in upper layer;
12 is a metal plug in upper layer;
13 is a groove;
14 is a first inter-level isolation film;
15 is a second inter-level isolation film;
17 and 18 are each a third inter-level isolation film;
19 and 104 are each a resist mark;
101 is a thick isolation film;
102 is a metal layer;
103 is a first dielectric layer;
105 is a wiring in a wiring region of small wiring-to-wiring distance;
106 is a wiring in a wiring region of large wiring-to-wiring distance;
107 is a low-dielectric constant material;
108 is a hard oxide mask; and
109 is a second dielectric layer.

DETAILED DESCRIPTION OF THE INVENTION

Figure 1:
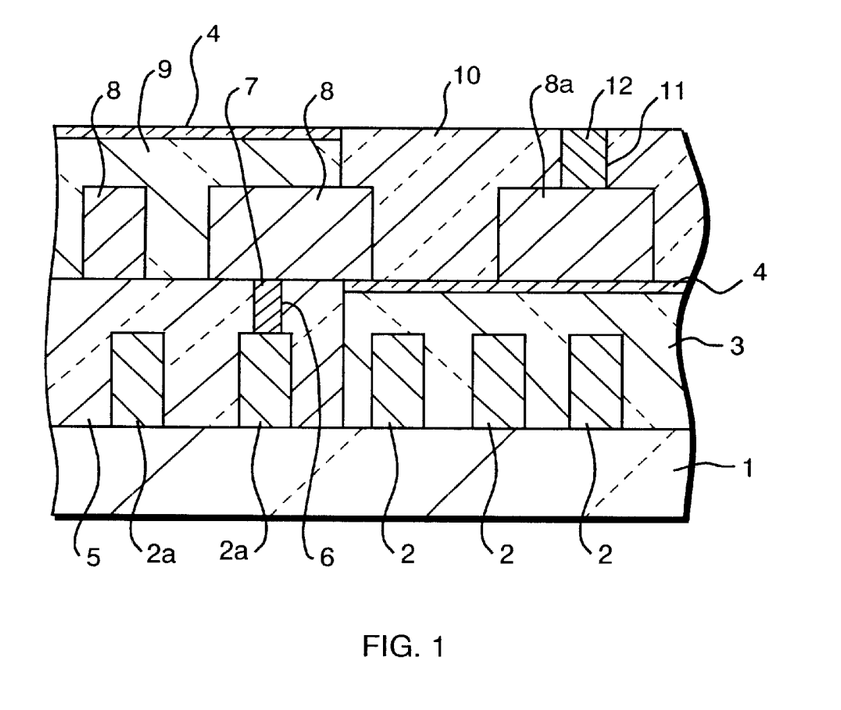
FIG. 1 is a sectional view of a wiring region of semiconductor device, for explaining the first embodiment of the present invention.
Figure 2A:
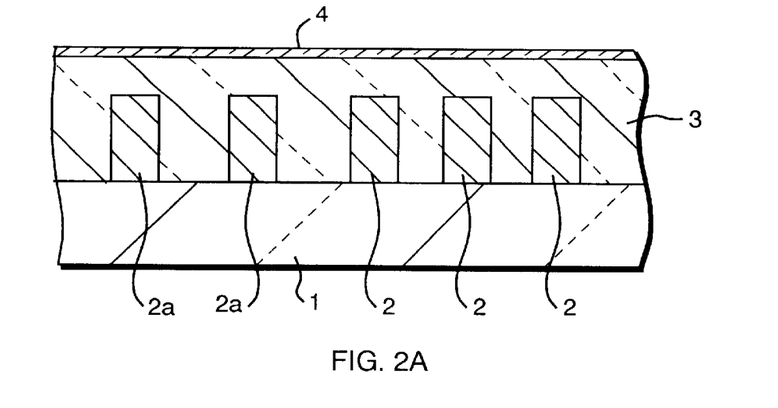
FIGS. 2A, 2B, 2C are sectional views showing the major production steps of the first embodiment of the present invention.
Figure 2B:
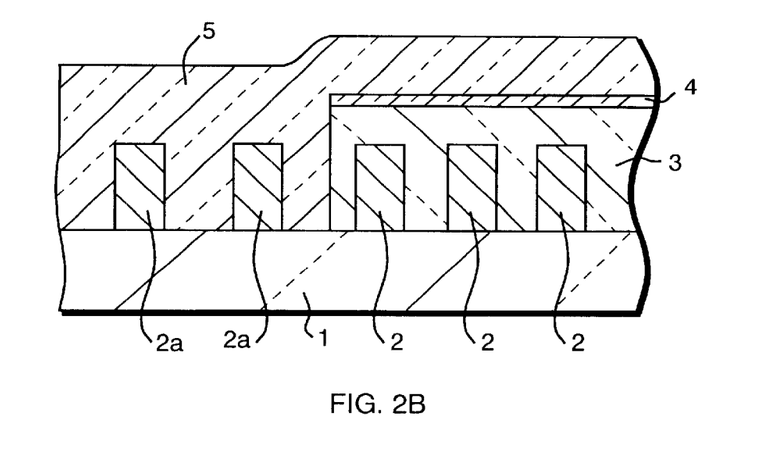
Figure 2C:
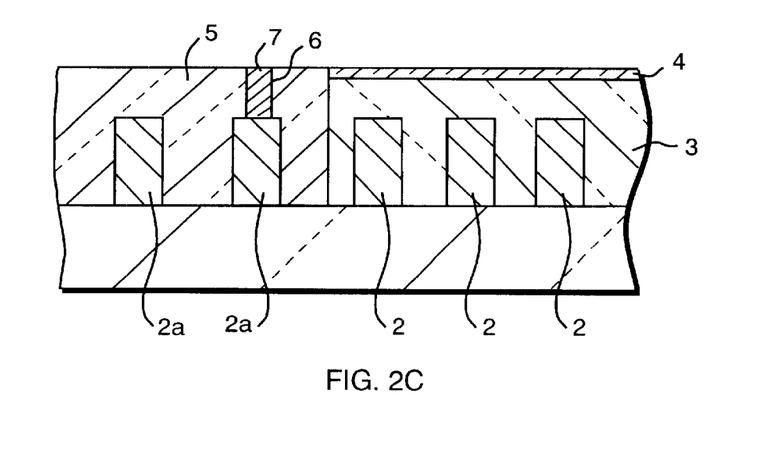

Embodiments of the present invention are described with reference to accompanying drawings. FIG. 1 is a sectional view of a wiring region of semiconductor device, for explaining the first embodiment of the present invention. FIG. 2 is sectional views showing the major steps employed in production of such a wiring region.

As shown in FIG. 1, a plurality of lower-layer wirings 2 and 2a are formed on a base inter-level isolation film 1 formed on a semiconductor substrate (e.g. a silicon substrate). The wirings 2 are formed in a wiring region of small wiring-to-wiring distance, and the wirings 2a are formed in a wiring region of large wiring-to-wiring distance. In the wiring region of small wiring-to-wiring distance, the distance between wirings is such that brings a noticeable increase in capacitance between wirings. This is usually less than 0.5 $\mu$m. On the other hand, in the wiring region of large wiring-to-wiring distance, the capacitance between wirings is not noticeably large. Where, the distance between wirings is usually more than or equal to 0.5 $\mu$m.

A first inter-level isolation film 3 is formed so as to fill the spacings between the wirings 2. On the first inter-level isolation film 3 is formed a protective isolation film 4. The base inter-level isolation film 1 is constituted by an ordinary silicon oxide film and has a relative dielectric constant of about 4.2. Meanwhile, the first inter-level isolation film 3 is constituted by an organic SOG film or the like and its relative dielectric constant is determined to be smaller than the relative dielectric constant of the isolation film 1. The protective isolation film 4 is constituted by an inorganic substance and, as will be mentioned later, functions as an etching stopper for the first inter-level isolation film 3.

In the region of wirings 2a having a large wiring-to-wiring distance is formed a second inter-level isolation film 5 as an inter-level isolation film. The second inter-level isolation film 5 is constituted by an isolation film of high moisture resistance and high quality. The film 5 is, for example, a silicon oxide film formed by chemical vapor deposition (CVD). In the given portions of the second inter-level isolation film 5 are formed throughholes 6. In each throughhole 6 is filled a metal plug 7, whereby electrical connection holds between the metal plug 7 and a wiring 2a.

No throughhole is formed in the first inter-level isolation film 3 made of a low-dielectric constant material and the protective isolation film 4 formed thereon.

An upper-layer wiring structure is formed in a manner similar to that used in formation of the lower-layer wiring structure. That is, on isolation films such as the protective isolation film 4, the second inter-level isolation film 5 and the like are formed upper-layer wirings 8a and 8, etc., and an upper-layer wiring 8 is connected with the metal plug 7. In the spacings between the upper-layer wirings 8 is filled a first inter-layer isolation film 9 made of a low-dielectric constant material and, on the first inter-level isolation film 9 is formed a protective isolation film 4. In the region of wirings 8a is formed a second inter-level isolation film 10 as an inter-level isolation film. The second inter-level isolation film 10, similarly to the second-inter level isolation film 5, is constituted by an isolation film of high moisture resistance and high quality. In the given portions of the second inter-level isolation film 10 are formed throughholes 11. In each throughhole 11 is filled a metal plug 12.

In the above formation of an upper-layer wiring structure, the first inter-level isolation film 9 is formed on the second inter-level isolation film 5, and the second inter-level isolation film 10 is formed on the protective isolation film 4. The above constitution may be reversed. That is, the first inter-level isolation film 9 may be formed on the protective isolation film 4, and the second inter-level isolation film 10 may be formed on the second inter-level isolation film 5.

As described above, the feature of the wiring structure according to the first embodiment lies in that a first inter-level isolation film (which is a low dielectric constant isolation film) is formed in each wiring region of small wiring-to-wiring distance, a second inter-level isolation film of high moisture resistance and high quality is formed in each wiring region of large wiring-to-wiring distance and that throughholes are formed only in each second inter-level isolation film.

Next, description is made on the key steps employed in production of the above-mentioned wiring structure, with reference to FIG. 2. As shown in FIG. 2(a), a base inter-level isolation film 1 made of silicon oxide or the like is formed on a semiconductor substrate. On the isolation film 1 is deposited a metal by sputtering, to form a metal film. The metal film is an alloy film made of aluminum copper (AlCu) or the like and has a thickness of about 400 nm. The metal film may also be a laminated metal film made of, for example, Ti, TiN and AlCu.

Next, the metal film is subjected to fine processing by photolithography and dry etching to form lower-layer wirings 2 and 2a. The wirings 2 are wirings constituting a wiring region of small wiring-to-wiring distance, and the wirings 2a are wirings constituting a wiring region of large wiring-to-wiring distance.

On the whole surfaces of the isolation film 1 and the wirings 2 and 2a is formed a low-dielectric constant film, for example, by spin-coating, on the whole surfaces, a coating solution capable of forming an organic SOG film. The coating solution is filled over the wirings 2 and 2a. Then, a heat treatment is applied to heat-cure the solution and form an organic SOG film. The organic SOG film has a relative dielectric constant of 3 or less. The organic SOG film is subjected to chemical mechanical polishing (CMP) for levelling, whereby a first inter-level isolation film 3 as shown in FIG. 2(a) is formed. The first inter-level isolation film 3 is controlled so as to have a thickness of about 600 nm.

Next, on the first inter-level isolation film 3 is formed a protective isolation film 4. The protective isolation film 4 is formed by plasma CVD, is made of silicon nitride, silicon oxynitride or silicon carbide, and is controlled so as to have a thickness of about 50 nm.

Next, as shown in FIG. 2(b), photolithography and dry etching are applied to remove the protective isolation film 4 and the first inter-level isolation film 3 so that the portions of the film 4 and the film 3 both present in the region of wirings 2 are allowed to remain.

Next, a second inter-level isolation film 5 is formed by deposition so as to cover the wirings 2a and the protective isolation film 4. The second inter-level isolation film 5 is formed by plasma CVD using bias ECR, is made of silicon oxide, and has a thickness of about 800 nm.

Next, the second inter-level isolation film in a FIG. 2(b) state is levelled by CMP, as shown in FIG. 2(c). In this CMP, the protective isolation film 4 functions as an etching stopper. That is, by using an abrasive with which a silicon oxide film is selectively polished and to which a silicon nitride film or a silicon oxynitride film is resistant to polishing, the second inter-level isolation film 5 is polished selectively and the first inter-level isolation film 3 is protected from polishing owing to the presence of the protective isolation film 4. Further, the protective isolation film 4 can significantly improve the film thickness uniformity of the second inter-level isolation film 5 after polishing.

Next, throughholes 6 are formed in the given portions of the second inter-level isolation film 5, and a metal plug 7 is filled in each throughhole 7. The metal plug 7 is formed, for example, by formation of a tungsten film by CVD and polishing thereof by CMP.

Thus, a lower-layer wiring structure is formed. Thereon is formed an upper-layer wiring structure as mentioned with respect to FIG. 1. The process for formation of an upper-layer wiring structure is similar to the above-mentioned process for formation of a lower-layer wiring structure and, therefore, is not mentioned.

As the first inter-layer isolation film 3, there may be used a hygroscopic organic isolation film (e.g. a polyimide film), a porous inorganic SOG film having a density smaller than that of silicon oxide film, a porous organic SOG film or the like. Or, there may be used an inorganic isolation film such as SiOF film, SiBN film or the like.

Figure 3:
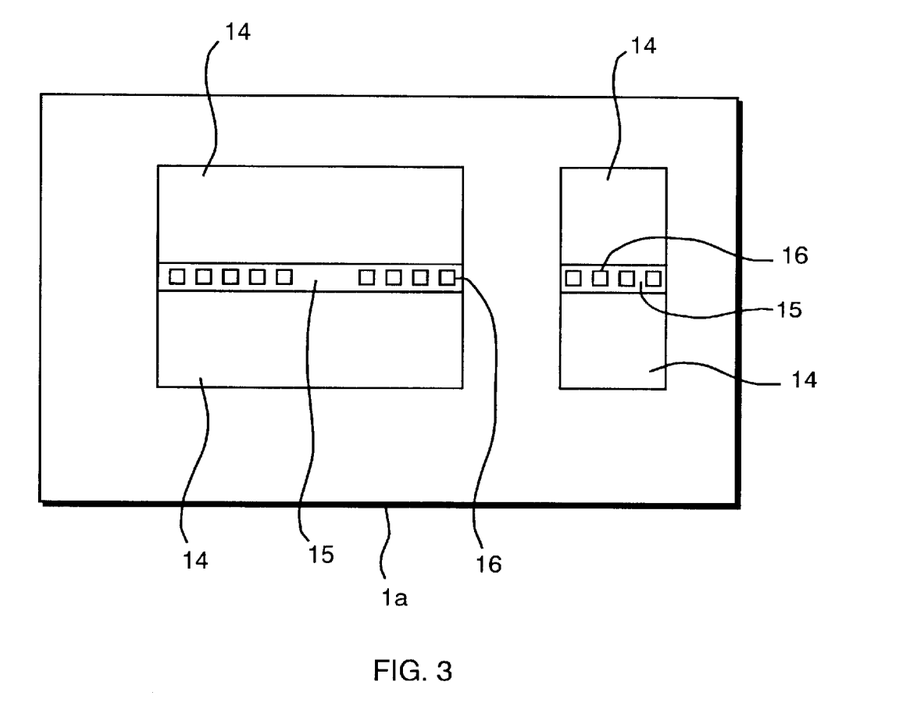
FIG. 3 is a plan view of a semiconductor device to which the present invention is applied.

One of the features of the wiring structure of the present invention lies in that a low-dielectric constant isolation film is selectively formed in each wiring region of small wiring-to-wiring distance, an inter-level isolation film of high moisture resistance and high quality is formed in each wiring region of large wiring-to-wiring distance and that throughholes are formed only in each inter-level isolation film of high moisture resistance and high quality. This feature is explained with reference to FIG. 3. FIG. 3 is a plan view of a semiconductor device to which the present invention is applied.

As shown in FIG. 3, a first inter-level isolation film 14 (which is a low-dielectric constant isolation film) is selectively formed on the given areas of a semiconductor chip 1a. Thereby, the parasitic capacitance between adjacent wirings is reduced and the transfer speed of signal is increased.

Further, a second inter-level isolation film 15 (which is an isolation film of high moisture resistance and high quality) is formed on an area of the semiconductor chip 1a. Throughholes 16 for connecting a lower wiring layer and an upper wiring layer are formed in the second inter-level isolation film 15. In each throughhole, a metal plug is filled.

In general, a low-dielectric constant isolation film has a large thermal expansion coefficient, a small strength and high hygroscopy. The hygroscopy becomes higher as the dielectric constant becomes smaller.

Therefore, when throughholes are formed in a low-dielectric constant isolation film, the electrical resistance of connections between lower-layer wirings and upper-layer wirings via these throughholes changes with the lapse of time. That is, the reliability of wirings decreases largely with the lapse of time. For example, the electrical resistance comes to increase due to the presence of moisture and resulting corrosion of wirings communicating with the throughholes or fluorination of aluminum metal. Such quality deterioration is more striking when the wiring structure has more layers. Due to such reduction in reliability of wiring structure, the dielectric constant of inter-level isolation film are not able to be lowered beyond a certain limit.

In contrast, in the above-mentioned embodiment of the present invention, throughholes are formed only in the second inter-level isolation film of high moisture resistance and high quality. Therefore, a multi-layered wiring structure of high performance and high reliability is made possible.

Figure 4:
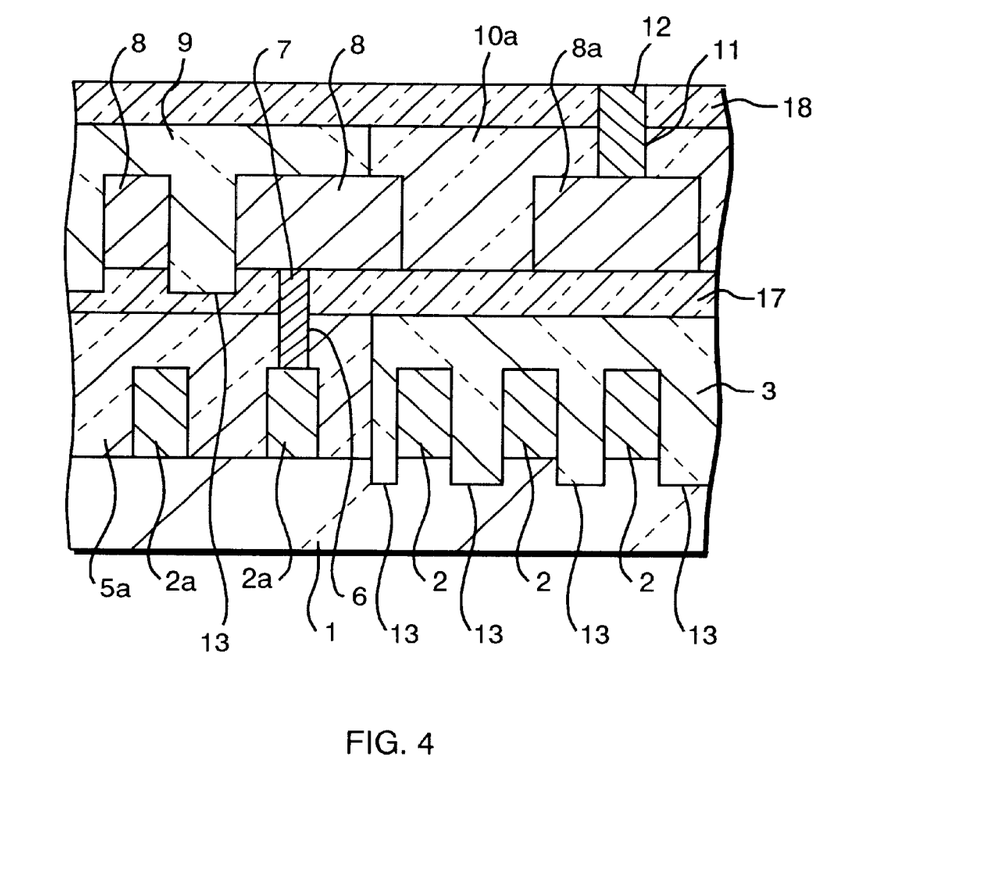
FIG. 4 is a sectional view of a wiring region of semiconductor device, for explaining the second embodiment of the present invention.
Figure 5A:
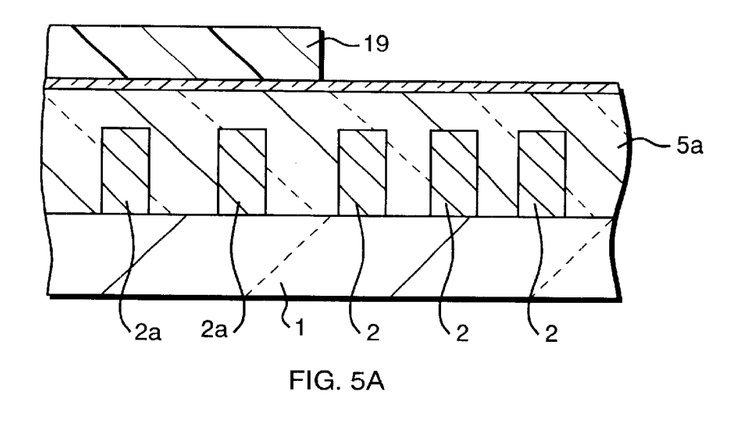
FIGS. 5A, 5B, 5C are sectional views showing the major production steps of the second embodiment of the present invention.
Figure 5B:
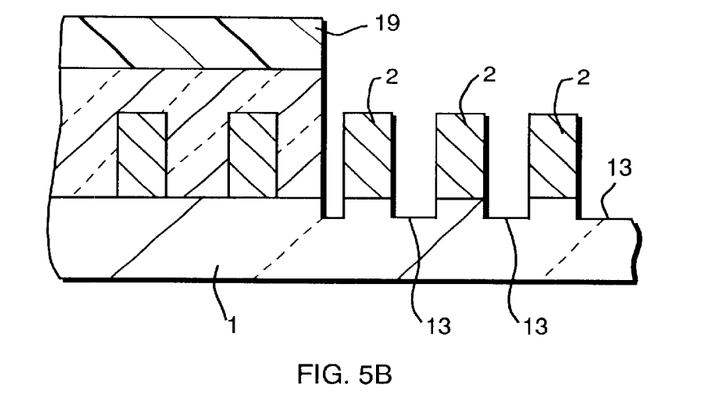
Figure 5C:
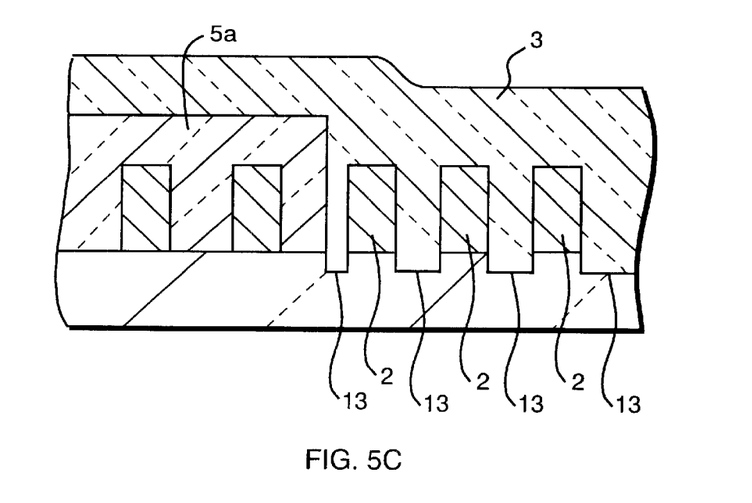
Figure 6A:
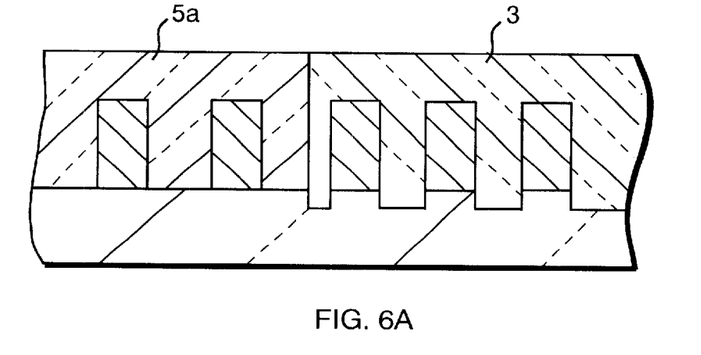
FIGS. 6A, 6B, 6C are sectional views showing the major production steps of the second embodiment of the present invention.
Figure 6B:
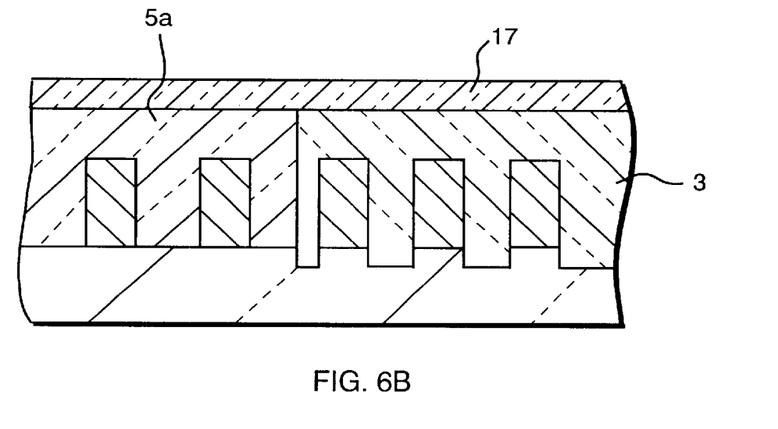
Figure 6C:
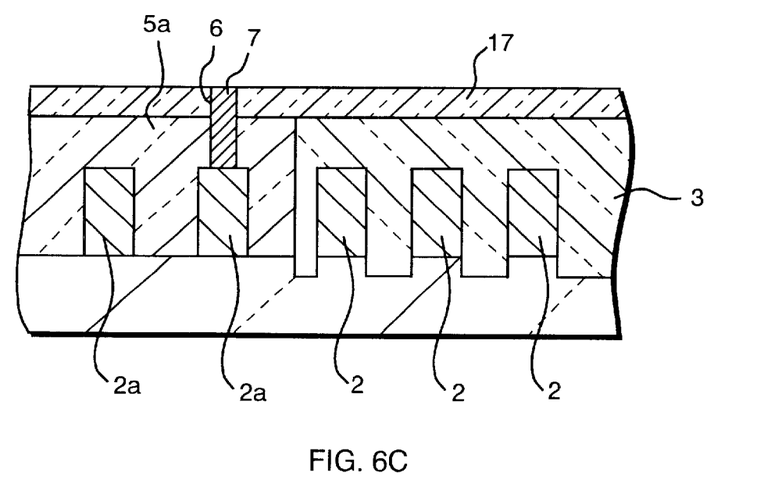

Next, description is made on the second embodiment of the present invention. FIG. 4 is a sectional view of a wiring portion of semiconductor device, for explaining the second embodiment of the present invention. FIG. 5 and FIG. 6 are sectional views showing the major steps employed in production of such a wiring portion. In FIGS. 4 to 6, members having the same functions as in the first embodiment are shown by the same symbols.

As shown in FIG. 4, a plurality of lower-layer wirings 2 and 2a are formed on a base inter-level isolation film 1 formed on a semiconductor substrate. In the surface areas of the isolation film 1 present between the wirings 2 are formed grooves 13. The wirings 2 are wirings of a wiring region of small wiring-to-wiring distance, and the wirings 2a are wirings of a wiring region of large wiring-to-wiring distance.

A first inter-level isolation film 3 is formed so as to fill the gaps between the wirings 2 and the grooves 13. The isolation film 1 is constituted by an ordinary silicon oxide film. Meanwhile, the first inter-level isolation film 3 is constituted by an organic SOG film or the like.

In the region of the wirings 2a having a large wiring-to-wiring distance is formed a second inter-level isolation film 5a as an inter-level isolation film. The second inter-level isolation film 5a is constituted by an isolation film of high moisture resistance and high quality which is made of an insulating material different from that used in the first inter-level isolation film 3. The isolation film 5a is, for example, a siliconoxynitride film formed by CVD.

A third inter-level isolation film 17 is formed so as to cover the first inter-level isolation film 3 and the second inter-level isolation film 5a. The third inter-level isolation film 17, similarly to the second inter-level isolation film 5a, is constituted by an isolation film of high moisture resistance and high quality.

In the given portions of the second interlevel isolation film 5a and the third inter-level isolation film 17 are formed throughholes 6. In each throughhole 6 is filled a metal plug 7, whereby electrical connection between plug and lower-layer wiring 2a is achieved.

Similarly to the case of the first embodiment, no throughhole is formed in the first inter-level isolation film 3 constituted by a low-dielectric constant isolation film.

An upper wiring layer is formed in a manner similar to that used in formation of a lower wiring layer. That is, upper-layer wirings 8a and 8, etc. are formed on the third inter-level isolation film 17, whereby electrical connection between upper-layer wiring 8 and metal plug 7 is achieved. In the surface areas of the isolation film 17 present between the wirings 8 are formed grooves 13. Between the wirings 8 and in the grooves 13 is filled a first inter-level isolation film 9 constituted by a low-dielectric constant isolation film. In the region of the wirings 8a having a large wiring-to-wiring distance is formed a second inter-level isolation film 10a as an inter-level isolation film. A third inter-level isolation film 18 is formed so as to cover the whole surfaces of isolation films 9 and 10a. The second inter-level isolation film 10a and the third inter-level isolation film 18 are each constituted by an isolation film of high moisture resistance and high quality. In the given portions of the second inter-level isolation film 10a and the third inter-level isolation film 18 are formed throughholes 11. In each throughhole 11 is filled a metal plug 12.

In the above-mentioned formation of an upper wiring layer, the first inter-level isolation film 9 is formed on the second inter-level isolation film 5a, and the second inter-level isolation film 10a is formed on the first inter-level isolation film 3. The above constitution may be reversed. That is, the first inter-level isolation film 9 is formed on the first inter-level isolation film 3, and the second inter-level isolation film 10a is formed on the second inter-level isolation film 5a.

As described above, the feature of the wiring structure according to the second embodiment of the present invention lies in that grooves of certain depth are formed at the surface areas of each isolation film present at the bottom of each wiring level, corresponding to each wiring region of small wiring-to-wiring distance but not covered by the wirings of the region. A low-dielectric constant isolation film is formed so as to fill not only between the wirings of the region but also the grooves. As a result, the parasitic capacitance between adjacent wirings due to the fringe effect is greatly reduced. This merit is more striking in a finer wiring structure.

The process for producing the above-mentioned wiring structure is described with reference to FIG. 5 and FIG. 6. As shown in FIG. 5(a), on a base inter-level isolation film 1 constituted by a silicon oxide film are formed lower-layer wirings 2 and 2a, in a manner similar to that mentioned in the first embodiment. The wirings 2 are wirings of a wiring region of small wiring-to-wiring distance, and the wirings 2a are wirings of a wiring region of large wiring-to-wiring distance. The wirings 2 and 2a have a line width of about 0.3 μm and a height of 0.4 μm.

Next, on the whole surfaces of the isolation film 1, the wirings 2 and the wirings 2a is formed a second inter-level isolation film 5a. The second inter-level isolation film 5a is a silicon oxynitride film formed by plasma CVD, and is levelled by CMP. On the surface area of the second inter-level isolation film 5a covering the wirings 2a is formed a resist mask 19. As shown in FIG. 5(b), by using the resist mask 19 as an etching mask, the second inter-level isolation film 5a in the wiring region of small wiring-to-wiring distance is subjected to anisotropic etching by RIE. In this case, even part of the surface of the isolation film 1 is etched by RIE and grooves 13 of the same pattern as the wirings 2 are formed. The depth of each groove is controlled similar to the line width of wiring 2. Then, the resist mask 19 is removed.

Next, as shown in FIG. 5(c), on the whole surfaces of the resulting material is formed a first inter-level isolation film 3. The first inter-level isolation film 3 is a low-dielectric constant isolation film constituted by, for example, an organic SOG film such as mentioned in the first embodiment. The thickness of the first inter-level isolation film 3 is controlled at about 600 nm.

Next, the first inter-level isolation film 3 in a FIG. 5(c) state is subjected to CMP for surface leveling, as shown in FIG. 6(a). In this polishing step, the second inter-level isolation film 5a functions as an etching stopper. That is, by using an abrasive with which the first inter-level isolation film constituted by an organic SOG film or the like is selectively polished and to which the second inter-level isolation film constituted by a silicon oxynitride film or the like has abrasion resistance, the first inter-level isolation film 3 is polished selectively.

Next, as shown in FIG. 6(b), a third inter-level isolation film 17 is formed on the levelled first inter-level isolation film 3 and the levelled second inter-level isolation film 5a. The third inter-level isolation film 17 is a silicon oxide film formed by CVD and has a thickness of about 300 nm. Thus, a lower-layer wiring structure is formed. As the first inter-level isolation film 3, there may be used a hygroscopic organic isolation film (e.g. a polyimide film), a porous inorganic SOG film having a density smaller than that of silicon oxide film, a porous organic SOG film or the like. Or, an inorganic isolation film such as SiOF film, SiBN film or the like may be used. In these cases, a silicon oxide film may be used as the second inter-level isolation film 5a.

Next, as shown in FIG. 6(c), throughholes 6 are formed in the given portions of the second inter-level isolation film 5a and the third inter-level isolation film 17, both present in the wiring region of large wiring-to-wiring distance. In each throughhole 6 is filled a metal plug 7, whereby electrical connection between metal plug 7 and wiring 2a is achieved.

Next, an upper-layer wiring structure as mentioned with respect to FIG. 4 is formed. The process for formation of an upper-layer wiring structure is performed in the similar manner to the above-described process for formation of a lower wiring layer.

In the second embodiment, each first inter-level isolation film formed in each wiring region of small wiring-to-wiring distance is filled even in the dents formed in each isolation film present beneath the wirings of the region. As a result, the parasitic capacitance generated between the bottom ends of adjacent wirings is reduced.

In the present invention, as the low-dielectric constant isolation film, there can be used, in addition to those films mentioned above in the embodiments, films of HSQ (hydrogen silsesquioxane), polyaryl ether, fluorinated polyaryl ether, inorganic polysilazane, organic polysilazane, BCB (benzocyclobutene), MSQ (methyl silsesquioxane), fluorinated polyimide, plasma CF polymer, plasma CH polymer, Teflon AF (trademark), Parylene N (trade mark), AF-4 (polyparaxylylene), Polynaphthalene N, etc.

As described above, in each wiring layer level of the semiconductor of the present invention, an inter-level isolation film of low dielectric constant is formed in the region of small wiring-to-wiring distance and an inter-level isolation film of high moisture resistance and high quality is formed in the region of large wiring-to-wiring distance; and throughholes for connecting lower-layer wirings and upper-layer wirings are formed only in the inter-level isolation film of high moisture resistance and high quality.

Further, in polishing and levelling of the first inter-level isolation film by CMP, the second inter-level isolation film is used as an etching stopper.

As a result, the reliability of connection between lower-layer wirings and upper-layer wirings is greatly improved and a fine multi-layered wiring structure is made possible. Further, the film thickness uniformity of the first inter-level isolation 3 on a semiconductor chip is greatly improved.

Further in the present invention, grooves of certain depth are formed at the surface areas of each isolation film present at the bottom of each wiring layer, corresponding to each wiring region of small wiring-to-wiring distance but not covered by the wirings of the region, and a low-dielectric constant film is formed so as to fill not only the spacings between the wirings of said region but also the grooves.

As a result, the parasitic capacitance between adjacent wirings due to the fringe effect is greatly reduced. This merit is more striking in a finer wiring structure.

Thus, there is easily obtained a fine multi-layered wiring structure of high performance and high reliability, required in a fine and multifunctional semiconductor device.

What is claimed is:

1. A semiconductor device comprising:
   a semiconductor substrate having semiconductor elements, and
   a plurality of wirings formed on the semiconductor substrate via an isolation film, wherein the wirings are formed in at least one layer level so that the region in which the wirings are formed is divided into at least one wiring region of small wiring-to-wiring distance between adjacent wirings and at least one wiring region of large wiring-to-wiring distance between adjacent wirings;
   a first inter-level isolation film is selectively formed only in the wiring region having said small wiring-to-wiring distance, said first inter-level isolation film covering at least a portion of a top surface and at least a portion of a side surface of the wirings of small wiring-to-wiring distance;
   a second inter-level isolation film is formed in the wiring region having said large wiring-to-wiring distance to cover the wirings;
   throughholes are formed only in the second inter-level isolation film; and
   the dielectric constant of the first inter-level isolation film is smaller than the dielectric constant of the second inter-level isolation film.

2. A semiconductor device according to claim 1, wherein the isolation film on the substrate is dented at the surface areas corresponding to the wiring region of small wiring-to-wiring distance but not covered by the wirings of the region and the resulting dents are filled with the first inter-level isolation film.

3. A semiconductor device according to claim 1, wherein the first inter-level isolation film is constituted by an organic film, an organic SOG film, a polyimide film, a porous inorganic SOG film having a density smaller than that of silicon oxide film, or a porous organic SOG film, and the second inter-level isolation film is constituted by a silicon oxide film or a silicon oxynitride film.

4. A semiconductor device according to claim 1, wherein the wirings are formed in a plurality of layer levels so that at each layer level the region in which the wirings are formed is divided into a wiring region of small wiring-to-wiring distance and a wiring region of large wiring-to-wiring distance; a first inter-level isolation film is selectively formed in the wiring region of small wiring-to-wiring distance and a second inter-level isolation film is formed in the wiring region of large wiring-to-wiring distance to cover the wirings; through-holes are formed only in the second inter-level isolation film; and the dielectric constant of the first inter-level isolation film is smaller than the dielectric constant of the second inter-level isolation film.

5. A semiconductor device according to claim 4, wherein the isolation film on the substrate is dented at the surface areas corresponding to the wiring region of small wiring-to-wiring distance but not covered by the wirings of the region and the resulting dents are filled with the first inter-level isolation film.

6. A semiconductor device according to claim 4, wherein the first inter-level isolation film is constituted by an organic film, an organic SOG film, a polyimide film, a porous inorganic SOG film having a density smaller than that of silicon oxide film, or a porous organic SOG film, and the second inter-level isolation film is constituted by a silicon oxide film or a silicon oxynitride film.

7. A semiconductor device comprising:
   a semiconductor substrate having semiconductor elements, and
   a plurality of wirings formed on the semiconductor substrate via an isolation film, wherein the wirings are formed in at least one layer level so that the region in which the wirings are formed on said semiconductor is divided into at least one wiring region of small wiring-to-wiring distance between adjacent wirings and at least one wiring region of large wiring-to-wiring distance between adjacent wirings;

a first inter-level isolation film is selectively formed only in the wiring region having said small wiring-to-wiring distance, said first inter-level isolation film disposed to cover at least a portion of a top surface and at least a portion of a side surface of the wirings of small wiring-to-wiring distance;

a second inter-level isolation film is formed in the wiring region having said large wiring-to-wiring distance to cover the wirings;

a third inter-level isolation film is formed so as to cover the first inter-level-isolation film and the second inter-level isolation film;

throughholes are formed only in the second inter-level isolation film and in the third inter-level isolation film; and the dielectric constant of the first inter-level isolation film is smaller than the dielectric constants of the second inter-level isolation film and the third inter-level isolation film.

8. A semiconductor device according to claim 7, wherein the isolation film on the substrated is dented at the surface areas corresponding to the wiring region of small wiring-to-wiring distance but not covered by the wirings of the region and the resulting dents are filled with the first inter-level isolation film.

9. A semiconductor device according to claim 7, wherein the first inter-level isolation film is constituted by an organic film, an organic SOG film, a polyimide film, a porous inorganic SOG film having a density smaller than that of silicon oxide film, or a porous organic SOG film, and the second inter-level isolation film is constituted by a silicon oxide film or a silicon oxynitride film.

10. A semiconductor device according to claim 7, wherein the wirings are formed in a plurality of layer levels so that at each layer level the region in which the wirings are formed is divided into a wiring region of small wiring-to-wiring distance and a wiring region of large wiring-to-wiring distance; a first inter-level isolation film is selectively formed in the wiring region of small wiring-to-wiring distance, a second inter-level isolation film is formed in the wiring region of large wiring-to-wiring distance to cover the wirings; and a third inter-level isolation film is formed so as to cover the first inter-level isolation film and the second inter-level isolation film; throughholes are formed only in the second inter-level isolation film and the third inter-level isolation film; and the dielectric constant of the first inter-level isolation film is smaller than the dielectric constants of the second inter-level isolation film and the third inter-level isolation film.

11. A semiconductor device according to claim 10, wherein the isolation film on the substrate is dented at the surface areas corresponding to the wiring region of small wiring-to-wiring distance but not covered by the wirings of the region and the resulting dents are filled with the first inter-level isolation film.

12. A semiconductor device according to claim 10, wherein the first inter-level isolation film is constituted by an organic film, an organic SOG film, a polyimide film, a porous inorganic SOG film having a density smaller than that of silicon oxide film, or a porous organic SOG film, and the second inter-level isolation film is constituted by a silicon oxide film or a silicon oxynitride film.

13. A wiring layer of a semiconductor device, comprising:

a first subset of wirings disposed upon a substrate wherein adjacent ones of the first subset of wirings are spaced relatively close together and covered with a first isolation material, wherein the first isolation material is formed only in a region of said first subset of wirings and covers at least a portion of a top surface and at least a portion of a side surface of the first subset of wirings;

a second subset of wirings disposed upon the substrate wherein adjacent ones of the second subset of wirings are spaced relatively far apart and covered with a second isolation material, said second isolation material having a higher dielectric constant than said first isolation material;

a third isolation material formed so as to cover said first and said second isolation materials; and a plurality of through holes provided only in said second isolation material and said third isolation material to provide electrical connections to said wirings, each comprising a metal plug substantially filling said through hole.

14. A wiring layer of a semiconductor device, according to claim 13, further comprising:

an inter-layer isolation layer on which the wirings are disposed.

15. A wiring layer of a semiconductor device, according to claim 13, further comprising:

a plurality of notches provided in said inter-layer isolation layer between the first subset of wirings.

16. A wiring layer of a semiconductor device, comprising:

a plurality of wirings disposed upon a substrate, wherein a first portion of said wirings form a wiring region having a small wiring-to-wiring distance between adjacent wirings therein, and a second portion of said wirings form another wiring region having a large wiring-to-wiring distance between adjacent wirings therein;

a first inter-level isolation film being selectively formed only in the wiring region having said small wiring-to-wiring distance, said first inter-level isolation film covering top surfaces and sides of said wirings;

a second inter-level isolation film being selectively formed only in the other wiring region having said large wiring-to-wiring distance, said second inter-level isolation film covering said wirings in said other wiring region; and a plurality of through holes provided only through said second inter-level isolation film, said dielectric constant of said first inter-level isolation film being smaller than the dielectric constant of said second inter-level isolation film.

17. A wiring layer of a semiconductor device, according to claim 16, wherein the isolation material covering the wirings that are relatively close together has the first dielectric constant which has a lower dielectric constant than the isolation material covering the wirings that are relatively far apart having the second dielectric constant.

18. A wiring layer of a semiconductor device, comprising:

first isolation means, covering at least a portion of a top surface and at least a portion of a side surface of a first subset of wirings having adjacent ones of said wirings spaced relatively close together, for providing electrical isolation for the first subset of wirings, said first isolation means being included only in said first subset of wirings;

second isolation means, covering a second subset of wirings having adjacent ones of said wirings spaced relatively far apart, for providing electrical isolation for the second subset of wirings, said second isolation means providing a higher dielectric constant than said first isolation means; and connection means for providing electrical connections to said wirings, wherein said connection means is disposed only through said second isolation means.

19. A wiring layer of a semiconductor device, according to claim 18, wherein said connection means includes a plurality of through holes, provided in said second isolation means, each said through holes being filled with a metal plug.

20. A wiring layer of a semiconductor device, according to claim 18, further comprising:

an inter-layer isolation layer on which said wirings are disposed.

21. A wiring layer of a semiconductor device, according to claim 20, further comprising:

means, provided in said inter-layer isolation layer, for enhancing electrical isolation between wirings that are relatively close.

22. A wiring layer of a semiconductor device, according to claim 21, wherein the means for enhancing electrical isolation includes a plurality of notches provided in said inter-layer isolation layer between said wirings.

* * * * *